(12) United States Patent
Chang et al.

(10) Patent No.: US 9,250,279 B2
(45) Date of Patent: Feb. 2, 2016

(54) MEASURING SYSTEM

(71) Applicant: Wistron Corporation, New Taipei (TW)

(72) Inventors: Hung-Kai Chang, New Taipei (TW);
Chung-Yaw Su, New Taipei (TW);
Chiu-Hsien Chang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 326 days.

(21) Appl. No.: 13/792,240

(22) Filed: Mar. 11, 2013

(65) Prior Publication Data

US 2014/0021964 A1 Jan. 23, 2014

(30) Foreign Application Priority Data

Jul. 20, 2012 (TW) .............................. 101126259 A (51) Int. Cl.
| | |
|---|---|
| *G01R 29/26* | (2006.01) |
| *G01R 1/067* | (2006.01) |
| *G01R 23/16* | (2006.01) |
| *G01R 31/00* | (2006.01) |

(52) U.S. Cl.
CPC ............ *G01R 29/26* (2013.01); *G01R 1/06766* (2013.01); *G01R 1/06788* (2013.01); *G01R 23/16* (2013.01); *G01R 31/001* (2013.01)

(58) Field of Classification Search
CPC ..... G01R 29/26; G01R 29/0814; G01R 23/00
USPC .......................................................... 324/613
See application file for complete search history.

(56) References Cited

U.S. PATENT DOCUMENTS

| | | | | |
|---|---|---|---|---|
| 4,168,516 A | * | 9/1979 | Lace ....................... | G01P 1/103 361/241 |
| 6,049,219 A | * | 4/2000 | Hwang .............. | G01R 1/06772 324/750.3 |
| 6,841,986 B1 | * | 1/2005 | Tannehill ........... | G01R 1/06788 324/754.29 |

(Continued)

FOREIGN PATENT DOCUMENTS

| | | |
|---|---|---|
| CN | 1635385 A | 7/2005 |
| TW | 200520421 | 6/2005 |
| TW | 201009354 | 3/2010 |

OTHER PUBLICATIONS

Office action mailed on Jan. 24, 2014 for the Taiwan application No. 101126259, filing date: Jul. 20, 2012, p. 3 line 3-26, p. 4-6 and p. 7 line 1-21.

(Continued)

*Primary Examiner* — Tung X Nguyen
*Assistant Examiner* — Dominic Hawkins
(74) *Attorney, Agent, or Firm* — Winston Hsu; Scott Margo (57) ABSTRACT

A measuring system for measuring signal characteristics on a node is disclosed. The measuring system includes a contact measuring unit including a probe for contacting the node to fetch a signal on the node, an output interface, a plurality of capacitors coupled between the probe and the output interface where a capacitance of each capacitor corresponds to a frequency range, and a protection circuit, of which one terminal coupled between the probe and the output interface and the other terminal coupled to a ground terminal, and a frequency analyzer coupled to the output interface for displaying information of amplitude vs. frequency of a signal outputted from the output interface to measure the signal characteristic on the node.

19 Claims, 7 Drawing Sheets

(56) References Cited

U.S. PATENT DOCUMENTS

| | | |
|---|---|---|
| 8,098,094 B2 | 1/2012 | Gilbert |
| 2002/0001361 A1* | 1/2002 | Ueno ............... H03L 7/099 375/376 |
| 2002/0008526 A1* | 1/2002 | Martin ............. G01F 23/26 324/678 |
| 2006/0126254 A1* | 6/2006 | Auriel ............ H01L 23/5223 361/118 |
| 2006/0226916 A1* | 10/2006 | Florescu ........... H01L 7/0898 331/16 |
| 2010/0201388 A1* | 8/2010 | Forbes ............. G01R 1/06788 324/755.02 |

OTHER PUBLICATIONS

Office action mailed on Jul. 13, 2015 for the China application No. 201210268173.2, p. 3 line 4-30, p. 4-6 and p. 7 line 1-21.

\* cited by examiner

MEASURING SYSTEM

BACKGROUND OF THE INVENTION

1. Field of the Invention

The present invention relates to a measuring system, and more particularly, to a measuring system capable of contacting a node with a probe to measure characteristics of a signal on the node precisely, and filtering the signal to a specific frequency range in which the signal is required to be measured through a plurality of capacitors, to display information of amplitude vs. frequency of the signal on a frequency analyzer.

2. Description of the Prior Art

With the improvement of technology, electronic products are all desired to be of smaller size and higher performance nowadays, such that density of elements distributed on a circuit board keeps increasing, and circuit areas shrink substantially. However, when the circuit areas become smaller, more and more elements are crowded into a small space, which causes higher interferences between each other. Among the interferences, an electromagnetic interference (EMI) is one of the problems most troublesome in the industry. Since EMI is concerned with many factors and needs a wider range of professional knowledge to be solved, it has confused design engineers of electronic systems for a long time. However, under higher competition in the high technology electronic industry and shorter life cycle of new products, how to solve EMI rapidly becomes a challenge for all electronic engineers.

Figure 1:
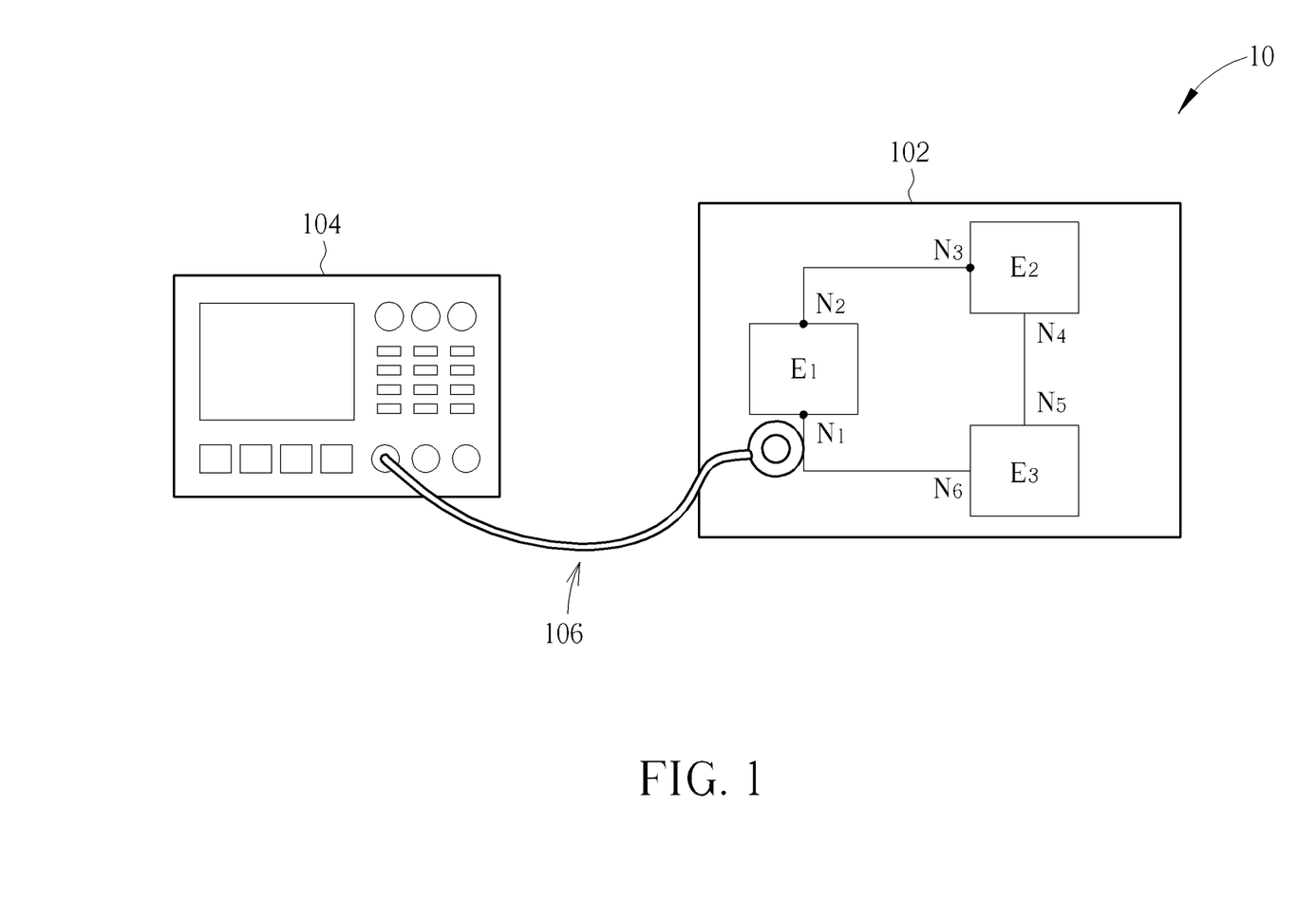
FIG. 1 is a schematic diagram of a conventional measuring system.
Figure 2:
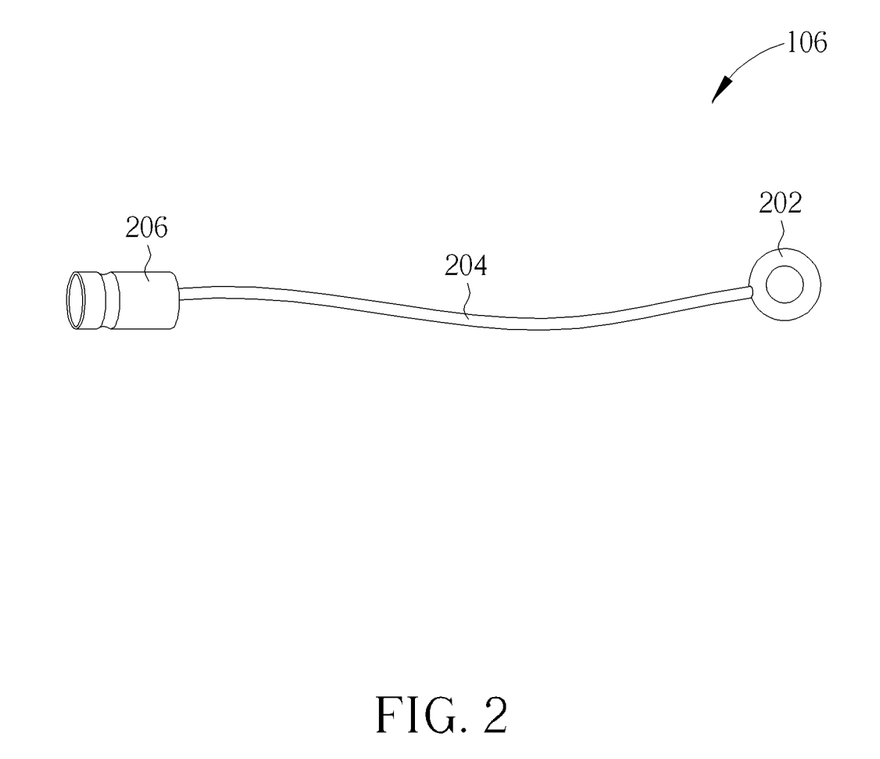
FIG. 2 is a schematic diagram of a conventional probe.

A conventional measuring system 10 for measuring EMI can be referred to FIG. 1. The measuring system 10 includes a frequency analyzer 104 and a probe 106, utilized for measuring EMI on a circuit board 102. The circuit board 102 includes electronic elements $E_1$~$E_3$ and nodes $N_1$~$N_6$, wherein the electronic elements $E_1$~$E_3$ are connected to each other through the nodes $N_1$~$N_6$ and circuits. Structure of the probe 106 is shown in FIG. 2. The probe 106 includes a circular terminal 202, a line 204, and an output interface 206. When EMI on the node $N_1$ needs to be measured, the circular terminal 202 can be placed near the node $N_1$ to measure EMI signal dissipated from the node $N_1$. Then, the signal is transmitted to the frequency analyzer 104 through the line 204 and the output interface 206, and information of amplitude vs. frequency of the signal is displayed on the frequency analyzer 104.

However, each node $N_1$~$N_6$ on the circuit board 102 may dissipate EMI signals. When measuring the EMI signal on the node $N_1$ with the conventional EMI measurement method, the circular terminal 202 may also receive electromagnetic signals dissipated from the other nodes $N_2$~$N_6$. The nodes $N_2$~$N_6$ closer to the circular terminal 202 have a higher probability of causing a measurement error, so as to affect the measurement result. Moreover, when excess EMI on the circuit board 102 is known, and from which node or element on the circuit board 102 the excess EMI is generated needs to be determined, the conventional EMI measurement method with the circular terminal 202 may not achieve accurate results.

Besides, almost all of the main advanced countries in the world define a standard for electromagnetic compatibility (EMC) and EMI of electronic devices. The current mainstream standard for EMI falls within the frequency range 30 MHz~1 GHz, wherein the energy of an EMI signal is required to be lower than a specific value. However, in order to meet each kind of requirement, the frequency analyzer 104 always provides a greater frequency range for measurement (e.g. 3 MHz~3 GHz), and can not provide measurement results more accurately for a specific requirement in a specific frequency range. Thus, there is a need for improvement of the prior art.

SUMMARY OF THE INVENTION

It is therefore an objective of the present invention to provide a measuring system capable of contacting a node with a probe to measure characteristics of a signal on the node precisely, and filtering the signal to a specific frequency range in which the signal is required to be measured through a plurality of capacitors, to display information of amplitude vs. frequency of the signal on a frequency analyzer.

The present invention discloses a measuring system for measuring signal characteristics on a node. The measuring system comprises a contact measuring unit comprising a probe for contacting the node to fetch a signal on the node, an output interface, a plurality of capacitors coupled between the probe and the output interface with a capacitance of each capacitor corresponding to a frequency range, a protection circuit of which one terminal is coupled between the probe and the output interface and the other terminal is coupled to a ground terminal, and a frequency analyzer coupled to the output interface for displaying information of amplitude vs. frequency of a signal outputted from the output interface to measure the signal characteristics on the node.

The present invention further discloses a measurement method for measuring signal characteristics of anode. The measurement method comprises contacting the node with a probe to fetch a signal on the node and transmitting the signal on the node to a frequency analyzer through a plurality of capacitors and a protection circuit, and displaying information of amplitude vs. frequency of the signal with the frequency analyzer to measure the signal characteristics on the node, wherein a capacitance of each capacitor among the plurality of capacitors is corresponding to a frequency range.

These and other features, aspects, and advantages of the present invention will become better understood with reference to the following description of the preferred embodiment that is illustrated in the various figures and drawings.

DETAILED DESCRIPTION

Figure 3:
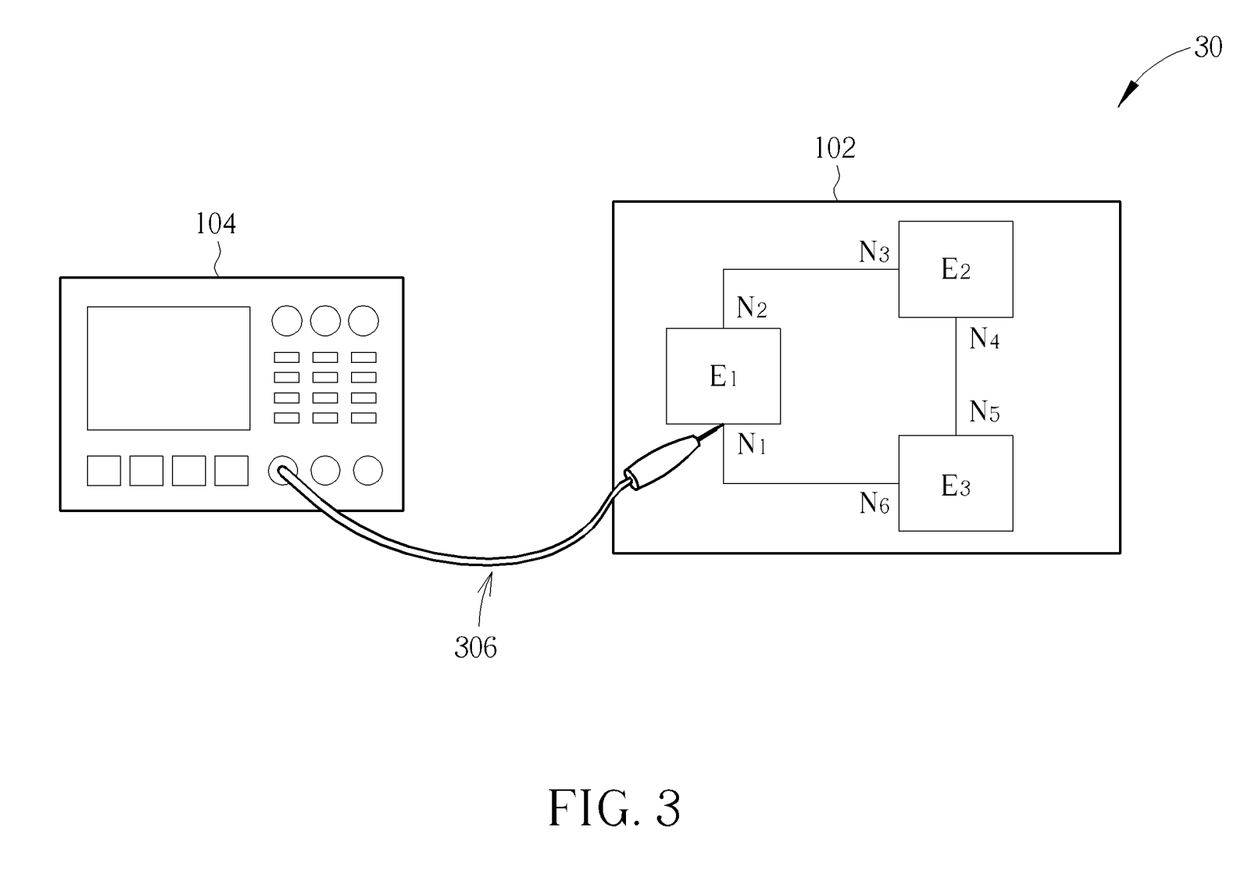
FIG. 3 is a schematic diagram of a measuring system according to an embodiment of the present invention.

Please refer to FIG. 3, which is a schematic diagram of a measuring system 30 according to an embodiment of the present invention. As shown in FIG. 3, structure of the measuring system 30 is similar to that of the measuring system 10 in FIG. 1, and hence the same elements are denoted by the same symbols. The main difference between the measuring system 30 and the measuring system 10 is that the measuring system 30 utilizes a contact measuring unit 306 to replace the probe 106 in the measuring system 10, to measure EMI on a specific node with a contact measurement method.

Figure 4:
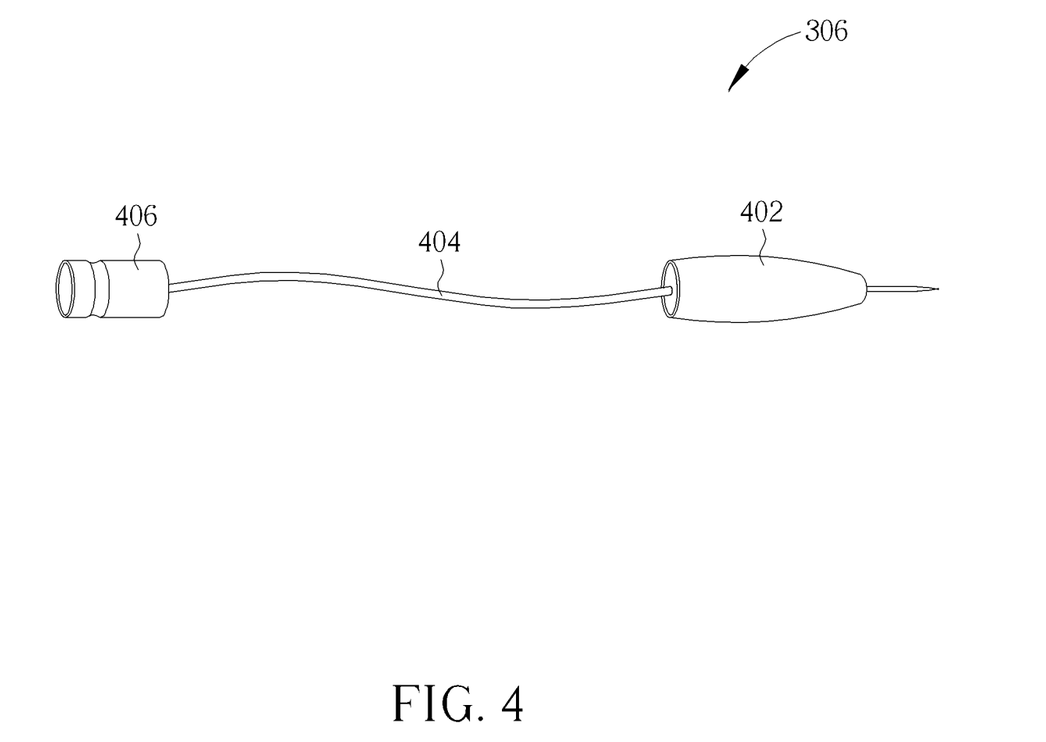
FIG. 4 is a schematic diagram of a contact measuring unit according to an embodiment of the present invention.

Detailed structure of the contact measuring unit 306 is shown in FIG. 4. The contact measuring unit 306 includes a probe 402, a line 404, and an output interface 406. The probe 402 is utilized for contacting a node to fetch a signal on the node. For example, if a signal on the node $N_1$ is required to be measured, the probe 402 can be utilized for contacting the node $N_1$ to fetch the signal on the node $N_1$. The line 404, coupled to the probe 402, is utilized for transmitting the signal. The output interface 406, coupled to the line 404, is utilized for connecting the contact measuring unit 306 and the frequency analyzer 104. The output interface 406 is commonly a connector, and usually complies with a specification of a Bayonet Neill-Concelman (BNC) connector. The signal received by the probe 402 can be transmitted to the frequency analyzer 104 through the line 404 and the output interface 406, to display information of amplitude vs. frequency of the signal on the frequency analyzer 104.

Take a common EMI signal measurement for example, if an EMI signal on the node $N_1$ is required to be measured, the probe 402 can be utilized for contacting the node $N_1$ on the circuit board 102 to fetch the EMI signal on the node $N_1$, and the EMI signal is transmitted to the frequency analyzer 104 through the line 404 and the output interface 406 to display information of amplitude vs. frequency of the EMI signal on the frequency analyzer 104. However, each of the nodes $N_1 \sim N_6$ on the circuit board 102 may dissipate EMI signals, and the method of fetching the EMI signal by contacting the node $N_1$ with the probe 402 can avoid receiving the EMI signals dissipated from the other nodes $N_2 \sim N_6$ simultaneously. Besides, when excess EMI on the circuit board 102 is known, and from which node or element on the circuit board 102 the excess EMI is generated needs to be determined, the probe 402 can be utilized for contacting each of the nodes $N_1 \sim N_6$ on the circuit board 102, to measure the EMI signal on each of the nodes $N_1 \sim N_6$, respectively, so as to find out which node has the excess EMI.

Please note that, almost all of the main advanced countries in the world define a standard for electromagnetic compatibility (EMC) and EMI of electronic devices. The current mainstream standard for EMI falls within the frequency range 30 MHz~1 GHz, wherein the energy of an EMI signal is required to be lower than a specific value. If an EMI signal within a specific frequency range (e.g. 30 MHz~1 GHz) is required to be measured, for the sake of a precise measurement result, the EMI signal in other frequency ranges needs to be excluded, and only the EMI signal within the specific frequency range is allowed. Please refer to FIG. 5, which is a schematic diagram of a circuit 50 according to an embodiment of the present invention. The circuit 50 may be set between the probe 402 and the output interface 406, and include an input terminal 502, an output terminal 504, a protection circuit 506 and capacitors $C_1 \sim C_n$. The input terminal 502, coupled to the probe 402, is utilized for providing an input interface for the signal. The output terminal 504, coupled to the output interface 406, is utilized for providing an output interface for the signal. The protection circuit 506, of which a terminal is coupled between the input terminal 502 and the output terminal 504, and the other terminal is coupled to a ground terminal and is utilized for providing a discharge path to prevent a large current from flowing into the input terminal 502 through the output terminal 504 and the output interface 406 to the frequency analyzer 104 which causes the frequency analyzer 104 to be damaged. A common protection circuit includes a resistor or a Zener diode. The capacitors $C_1 \sim C_n$ are coupled between the input terminal 502 and the output terminal 504 and a capacitance of each of the capacitors $C_1 \sim C_n$ is corresponding to a frequency range. The capacitance of each capacitor $C_1 \sim C_n$ can be determined according to the frequency range required to be measured.

Figure 5:
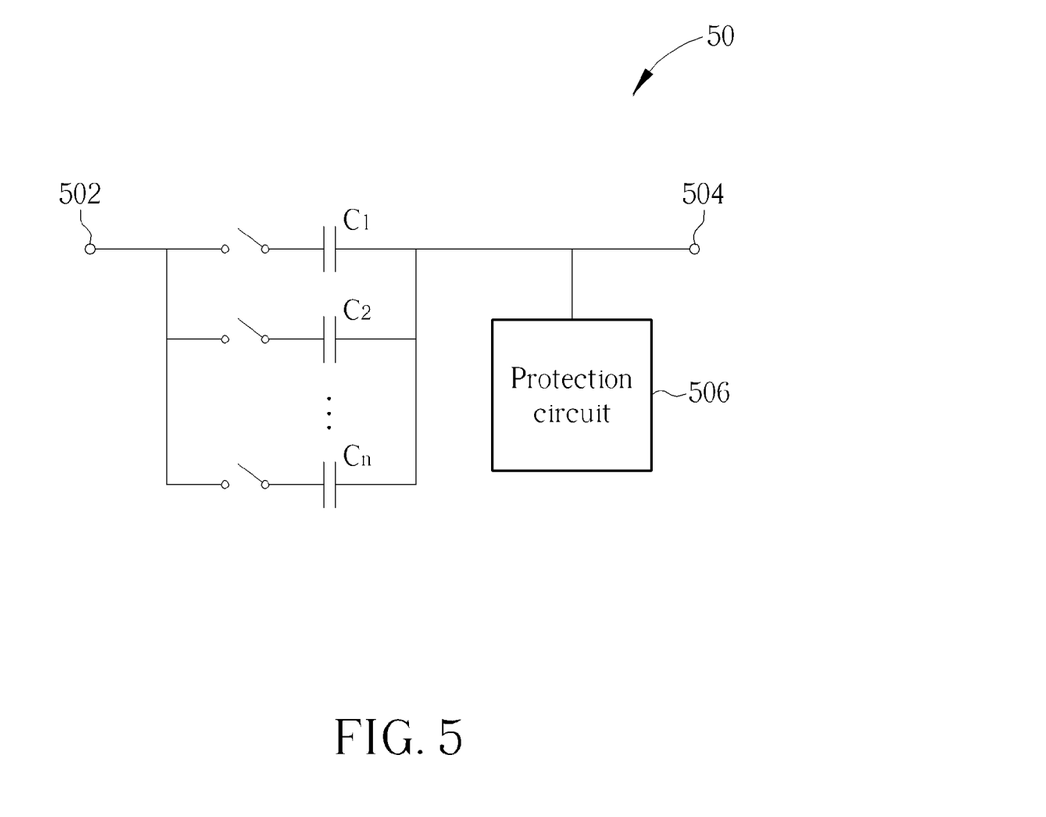
FIG. 5 is a schematic diagram of a circuit according to an embodiment of the present invention.

In detail, if a signal is required to be measured within a smaller specific frequency range, only one capacitor $C_1$ may be utilized, and the capacitance of the capacitor $C_1$ may be determined corresponding to the specific frequency range to pass the signal within the specific frequency range. If a signal is required to be measured within a greater specific frequency range, more capacitors $C_1 \sim C_n$ may be utilized for selection between the capacitors $C_1 \sim C_n$, wherein the capacitors $C_1 \sim C_n$ possess different capacitances, each of which is corresponding to a frequency range, and the greater specific frequency range may be equal to a total frequency range combined with the frequency ranges corresponding to these capacitances. For example, if the specific frequency range for EMI (i.e. 30 MHz~1 GHz) is required to be measured, four capacitors $C_1 \sim C_4$ may be utilized, wherein the capacitance of the capacitor $C_1$ is set to be 0.1 microfarad (μF), which is corresponding to the frequency range around 30 MHz~200 MHz; the capacitance of the capacitor $C_2$ is set to be 0.01 μF, which is corresponding to the frequency range around 200 MHz~400 MHz; the capacitance of the capacitor $C_3$ is set to be 1000 picofarad (pF), which is corresponding to the frequency range around 400 MHz~800 MHz; and the capacitance of the capacitor $C_4$ is set to be 10 pF, which is corresponding to the frequency range around 800 MHz~1 GHz. The total frequency range 30 MHz~1 GHz, combined with the four frequency ranges corresponding to the capacitances of the four capacitors via the selection between the capacitors $C_1 \sim C_4$, is the frequency range required to be measured.

Figure 6:
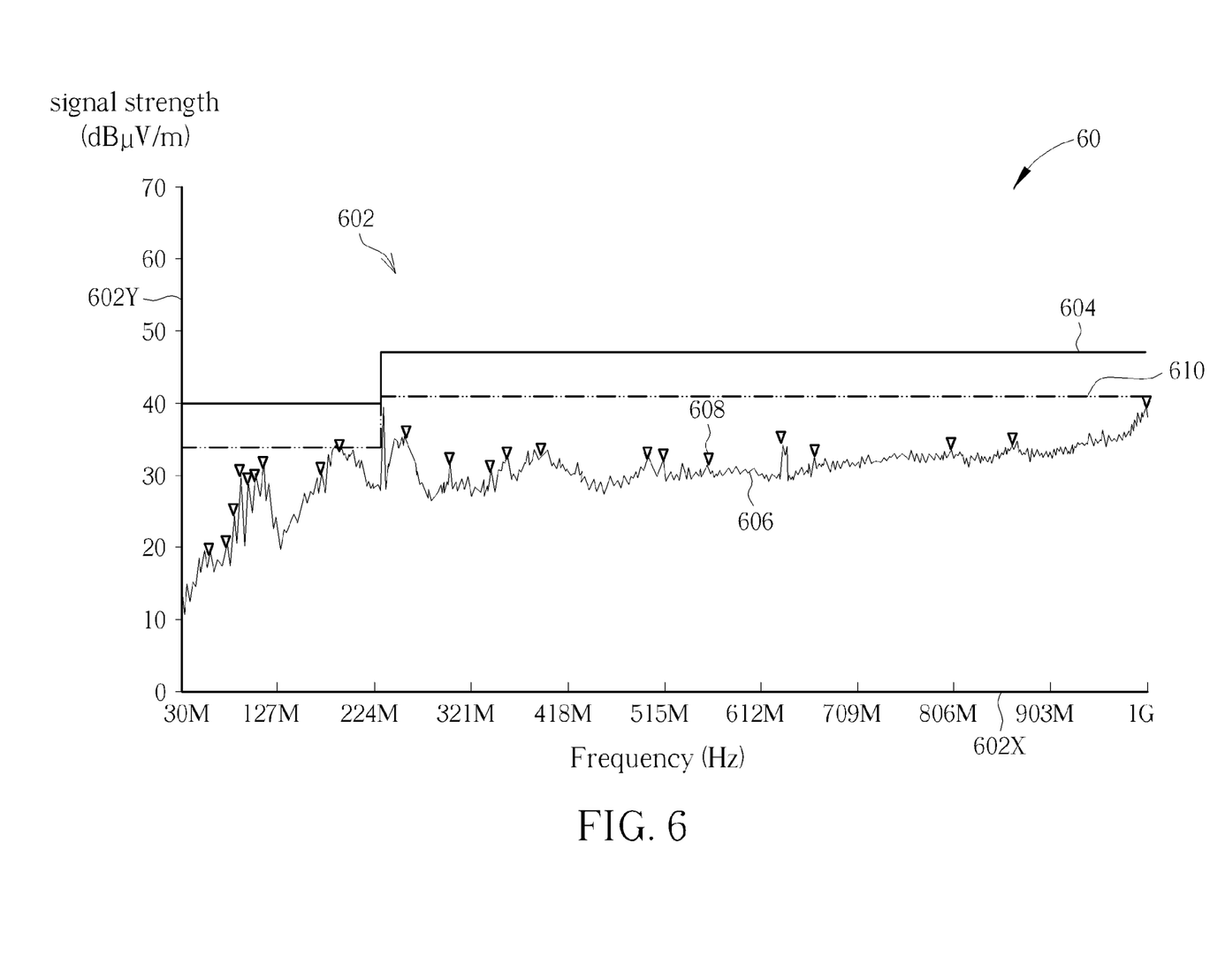
FIG. 6 is a screenshot displaying a measurement result according to an embodiment of the present invention.

A measurement result of EMI can be referred to FIG. 6, which is a screenshot 60 of displaying a measurement result on the frequency analyzer 104 according to an embodiment of the present invention. The screenshot 60 includes a signal strength distribution diagram 602, which displays the following information: a standard value 604, a signal strength value 606, a plurality of maximum signal strengths within an interval 608, and a stricter standard value 610. A horizontal axis 602X of the signal strength distribution diagram 602 denotes frequency, which has a unit of hertz (Hz), and the measured frequency range is equal to the specific frequency range for EMI (30 MHz~1 GHz). A vertical axis 602Y denotes signal strength, which has a unit of dBμV/m. The standard value 604 complies with the EMI standard values defined by Bureau of Standards, Metrology and Inspection (BSMI), wherein Class A defines the specification that within the frequency range 30 MHz~230 MHz, the upper limit of EMI signal strength is 40 dBμV/m, and within the frequency range 230 MHz~1 GHz, the upper limit of EMI signal strength is 47 dBμV/m. The signal strength value 606 is a signal strength measured on the node $N_1$ of the circuit board 102 by contacting the node $N_1$ by the probe 402. The plurality of maximum signal strengths within an interval 608 may be obtained by dividing the frequency range 30 MHz~1 GHz to a plurality of frequency intervals, and the maximum signal strengths within an interval 608 means the maximum signal strength in each interval. The stricter standard value 610 is a signal strength standard generated by reducing 6 dBμV/m from the standard value 604, to provide a stricter standard.

Please note that, the spirit of the present invention is to contact a node with the probe 402 to fetch a signal on the node, and utilize a plurality of capacitors $C_1 \sim C_n$ possessing different capacitances to filter the signal to a specific frequency range in which the signal is required to be measured, to measure signal characteristics on the node within the specific frequency range. Those skilled in the art can make modifications or alterations accordingly. For example, the application of the present invention is not limited to EMI measurement, and hence the frequency range required to be measured may not be 30 MHz~1 GHz, and may be any other frequency ranges. As a result, the capacitors $C_1$~$C_n$ may not be limited to the number and the capacitance values as shown above, and can be selected arbitrarily according to the frequency range required to be measured.

Figure 7:
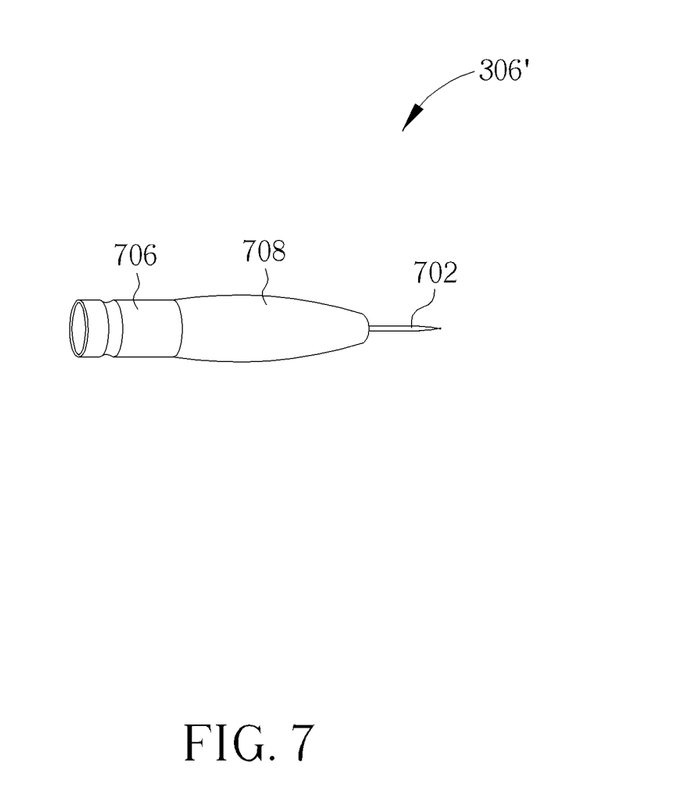
FIG. 7 is a schematic diagram of another contact measuring unit according to an embodiment of the present invention.

In addition, the implementation of the contact measuring unit 306 may not be limited to the above method as well. Please refer to FIG. 7, which is a schematic diagram of another contact measuring unit 306' according to an embodiment of the present invention. The contact measuring unit 306' includes a probe 702, an output interface 706, and a shell 708. Different from the contact measuring unit 306, the contact measuring unit 306' does not include a line, but includes a shell 708 for covering the capacitors $C_1$~$C_n$ and the protection circuit 506, and fixing the probe 402 and the output interface 406. Those skilled in the art can decide whether to utilize the line 404 and the shell 708 according to system requirements. Besides, the implementation of the protection circuit 506 may not be limited to a resistor or a Zener diode, and may also be a combination of both, or other devices capable of providing a discharge path to prevent a large current flowing to the frequency analyzer 104, which causes the frequency analyzer 104 to be damaged. If the protection circuit 506 is a resistor, a resistance value of the resistor may be 50 ohm, 100 ohm, or other resistance values enough for providing the discharge path, which is not limited herein. Similarly, the implementation of the output interface 406 may not be limited to the BNC connector as well, and other implementation may include an F-type connector, an M-type connector, an N-type connector, etc. which is not limited herein.

In the prior art, when measuring the EMI signal on the node $N_1$ with the circular terminal 202, the circular terminal 202 may also receive electromagnetic signals dissipated from the other nodes $N_2$~$N_6$ which may cause measurement error more probably, so as to affect the measurement result. Moreover, when excess EMI on the circuit board 102 is known, and from which node or element on the circuit board 102 the excess EMI is generated needs to be determined, the conventional method for measuring EMI with the circular terminal 202 may not achieve accurate results as well. Besides, in order to meet each kind of requirement, the frequency analyzer 104 always provides a greater frequency range for measurement, and can not provide measurement results more accurately for a specific requirement in a specific frequency range. In comparison, the present invention provides a measuring system capable of contacting a node with the probe 402, to measure characteristics of a signal on the node precisely, and when excess EMI on the circuit board 102 is known, and from which node or element on the circuit board 102 the excess EMI is generated needs to be determined, the probe 402 can be utilized for contacting each of the nodes $N_1$~$N_6$ on the circuit board 102, to measure the EMI signal on each of the nodes $N_1$~$N_6$, respectively, so as to find out which node has the excess EMI. In addition, the present invention further utilizes a plurality of capacitors $C_1$~$C_n$ possessing different capacitances to filter the signal to a specific frequency range in which the signal is required to be measured, to measure signal characteristics on the node $N_1$ within the specific frequency range.

To sum up, the measuring system of the present invention can measure the signal characteristics of a specific node precisely, and can filter the signal to a specific frequency range, to measure signal characteristics within the specific frequency range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A measuring system for measuring a signal characteristic on a node, the measuring system comprising:
   a contact measuring unit, comprising:
      a probe, for contacting the node to fetch a signal on the node;
      an output interface;
      a plurality of capacitors, coupled between the probe and the output interface, wherein a capacitance of each of the plurality of capacitors is corresponding to a frequency range, and the plurality of capacitors have different capacitances to be corresponding to different frequency ranges; and
      a protection circuit, of which one terminal coupled between the probe and the output interface and the other terminal coupled to a ground terminal, for providing a discharge path; and
   a frequency analyzer, coupled to the output interface, for displaying information of amplitude vs. frequency of a signal outputted from the output interface, to measure the signal characteristic on the node.

2. The measuring system of claim 1, wherein a plurality of capacitances of the plurality of capacitors is corresponding to a total frequency range, which is a combination of the frequency range corresponding to the capacitance of each capacitor.

3. The measuring system of claim 2, wherein the total frequency range is corresponding to the signal characteristic required to be measured, and is displayed on the frequency analyzer when the frequency analyzer displays the information of amplitude vs. frequency of the signal outputted from the output interface.

4. The measuring system of claim 3, wherein the signal characteristic is electromagnetic interference (EMI).

5. The measuring system of claim 1, wherein the protection circuit comprises a resistor.

6. The measuring system of claim 5, wherein a resistance value of the resistor is 50 ohm.

7. The measuring system of claim 1, wherein the protection circuit comprises a Zener diode.

8. The measuring system of claim 1, wherein the output interface complies with a specification of a Bayonet Neill-Concelman (BNC) connector.

9. The measuring system of claim 1, further comprising a line, wherein the probe is coupled to the output interface through the line.

10. The measuring system of claim 9, wherein a termination of the line complies with a specification of a Bayonet Neill-Concelman (BNC) connector.

11. The measuring system of claim 1, wherein the contact measuring unit further comprises a shell, for covering the plurality of capacitors and the protection circuit, and fixing the probe and the output interface.

12. A measurement method, for measuring a signal characteristic of a node, the measurement method comprising:
   contacting the node with a probe to fetch a signal on the node; and
   transmitting the signal on the node to a frequency analyzer through a plurality of capacitors and a protection circuit, to display information of amplitude vs. frequency of the signal on the frequency analyzer, to measure the signal characteristic on the node;

wherein a capacitance of each capacitor among the plurality of capacitors is corresponding to a frequency range, and the plurality of capacitors have different capacitances to be corresponding to different frequency ranges;

wherein the protection circuit is used for providing a discharge path.

13. The measurement method of claim 12, wherein a plurality of capacitances of the plurality of capacitors is corresponding to a total frequency range, which is a combination of the frequency range corresponding to the capacitance of each capacitor.

14. The measurement method of claim 13, wherein the total frequency range is corresponding to the signal characteristic required to be measured, and is displayed on the frequency analyzer when the frequency analyzer displays the information of amplitude vs. frequency of the signal.

15. The measurement method of claim 14, wherein the signal characteristic is electromagnetic interference (EMI).

16. The measurement method of claim 12, wherein the protection circuit comprises a resistor.

17. The measurement method of claim 16, wherein a resistance value of the resistor is 50 ohm.

18. The measurement method of claim 12, wherein the protection circuit comprises a Zener diode.

19. The measurement method of claim 12, wherein the output interface complies with a specification of a Bayonet Neill-Concelman (BNC) connector.

* * * * *